United States Patent [19]

Kuroda

[11] Patent Number: 4,893,009
[45] Date of Patent: Jan. 9, 1990

[54] SCANNING ELECTRON MICROSCOPE AND THE LIKE APPARATUS

[75] Inventor: Katsuhiro Kuroda, Hachioji, Japan
[73] Assignee: Hitachi, Ltd., Tokyo, Japan
[21] Appl. No.: 310,920
[22] Filed: Feb. 16, 1989

[30] Foreign Application Priority Data

Feb. 26, 1988 [JP] Japan .................................. 63-41986

[51] Int. Cl.4 ...................... H01J 37/28; H01J 37/244
[52] U.S. Cl. ...................................... 250/310; 250/397
[58] Field of Search ......................... 250/310, 307, 397

[56] References Cited

U.S. PATENT DOCUMENTS

| 3,792,263 | 2/1974 | Hashimoto et al. | 250/310 |
| 4,596,929 | 6/1956 | Coates et al. | 250/310 |
| 4,658,136 | 4/1987 | Ohtaka | 250/310 |

FOREIGN PATENT DOCUMENTS 62-186451  8/1987  Japan .

Primary Examiner—Jack I. Berman
Attorney, Agent, or Firm—Antonelli, Terry & Wands

[57] ABSTRACT

In a scanning electron microscope, voltage applied to the secondary electron detector for detection of secondary electrons released from a specimen bombarded with a primary electron beam is automatically changed in compliance with the change of acceleration voltage for the primary electron beam to ensure that even when the primary electron beam acceleration voltage changes over a wide range, intensity of a permeant electric field in the primary electron beam path which is created by the secondary electron attraction voltage applied to the secondary electron detector can always be controlled automatically such that deflection of the primary electron beam effected by the permeant field is negligible or almost zeroed. Even in the event that the primary electron beam acceleration voltage changes greatly, the primary electron beam will not undergo unwanted deflection due to the permeant field and degradation in resolution of secondary electron images can be prevented.

4 Claims, 3 Drawing Sheets

FIG. I
PRIOR ART

SCANNING ELECTRON MICROSCOPE AND THE LIKE APPARATUS

BACKGROUND OF THE INVENTION

This invention relates to improvements in scanning electron microscopes and the like apparatus and more particularly to a scanning electron microscope and the like which can permit the observation of high-resolution secondary electron images of specimens over a wide operation range covering operation at low acceleration voltage and operation at high acceleration voltage.

An electron beam apparatus in which a primary electron beam is irradiated or projected on a specimen to be observed and secondary electrons released from the specimen are detected to produce a second electron image of the specimen is well known as, for example, scanning electron microscope. In the electron beam apparatus, a secondary electron detector is applied with a high voltage of about 10 kV to attract secondary electrons released from the specimen for the purpose of efficiently collecting and detecting the secondary electrons.

An electric field created by the high voltage applied to the secondary electron detector naturally permeates into the primary electron beam path, raising a problem that the primary electron beam undergoes unwanted effects of deflection due to the permeant field. When acceleration operation is carried out at a high acceleration voltage for the primary electron beam which is several kilovolts or more, the amount of deflection of the primary electron beam caused by the permeant field is negligibly small and no serious problem occurs but conversely, for acceleration operation at a low primary electron beam acceleration voltage which is several kilovolts or less, the deflection amount becomes large and can not be neglected.

Especially where the specimen to be observed is disposed in an interior space of an objective lens and the secondary electron detector is disposed above the objective lens, the unwanted deflection of primary electron beam due to the permeant field greatly degrades resolution of produced secondary electron images. This is because the primary electron beam subject to the unwanted deflection is greatly affected by off-axial aberration of the objective lens.

A countermeasure for solving the above problems has hitherto been proposed as disclosed in, for example, JP-A-62-186451, according to which a plurality of secondary electron detectors (applied with high voltage) are provided which are differently distant from the optical axis of the primary electron beam and either one of the plurality of detectors is selectively used in compliance with the high or low level of the acceleration voltage for the primary electron beam (see FIG. 1).

Disadvantageously, the prior art apparatus must include the plurality of secondary electron detectors and accommodate a sufficient space for installation of the plurality of secondary electron detectors and in addition, because of the plural (2 to 4 at the most) detectors switched over for use, it is difficult to always maintain the optimum resolution by continuously complying with the change of acceleration over the wide range covering operation at low acceleration voltage and operation at high acceleration voltage.

SUMMARY OF THE INVENTION

An object of this invention is to provide an improved scanning electron microscope and the like apparatus which can always maintain optimum resolution over a wide operation range covering operation at low acceleration voltage and operation at high acceleration voltage.

The above object can be accomplished by controlling intensity of a permeant electric field in the primary electron beam path caused by high voltage applied to the secondary electron detector to a value by which deflection of the primary electron beam effected by the permeant field is sufficiently negligible. To this end, either the value of the high voltage per se, applied to the secondary electron detector, or the degree of the permeation of electric field into the primary electron beam path due to the high voltage may automatically changed in compliance with the value of the primary electron beam acceleration voltage.

Thus, the present invention features the provision of control circuit means for automatically changing the high voltage applied to the secondary electron detector in interlocked relationship with the change of the primary electron beam acceleration voltage, which relationship is precedently determined to always maintain the optimum resolution. The high voltage referred to herein as being applied to the secondary electron detector standing for an object to be controlled may obviously be either a high voltage applied to a scintillator portion of the secondary electron detector or a high voltage applied to a control electrode disposed before the scintillator. Thus, in accordance with the invention, either the high voltage value applied to the scintillator portion of the secondary electron detector or that applied to the control electrode may be controlled.

Other features and attendant advantages of the invention will be readily appreciated as the same is explained by reference to the following embodiments.

DESCRIPTION OF THE PREFERRED EMBODIMENTS

The invention will now be described by way of example with reference to the accompanying drawings.

In order to prevent the degradation in resolution caused by the unwanted deflection of primary electron beam due to the permeation of electric field into the primary electron beam path, which permeation is caused by a high voltage applied to the secondary electron detector, it is necessary that intensity of the permeant field be so controlled as to be decreased to an extent that the permeant field created in the primary electron beam path under the application of the high voltage to the secondary electron detector always deflects the primary electron beam only negligibly over a wide operation range covering operations at low acceleration voltage and at high acceleration voltage for the primary electron beam.

Electric field of the secondary electron detector permeating into the primary electron beam path may be controlled by either controlling high voltage per se applied to the detector or disposing a control electrode for control of the permeant voltage, created under the application of the high voltage, in front of the detector. Generally, the secondary electron detector is comprised of a scintillator portion which radiates photons when bombarded with secondary electrons and a photo-multiplier for detecting the photons with high sensitivity. A high voltage of about 10 kV is typically applied to the scintillator portion but even under the application of a voltage of the order of several kilovolts or more, the scintillator portion can usually scintillate. Therefore, in the former control method, the voltage applied to the scintillator portion is directly controlled in interlocked relationship with the change of acceleration voltage for the primary electron beam. In the latter control method, voltage applied to the control electrode disposed before the detector is controlled in interlocked relationship with the change of acceleration voltage for the primary electron beam while maintaining the voltage applied to the scintillator portion at a constant value. In this manner, the continuous detection of secondary electrons can be ensured which does not almost affect the primary electron beam over the wide operation range covering operations at low acceleration voltage and at high acceleration voltage.

Figure 2:
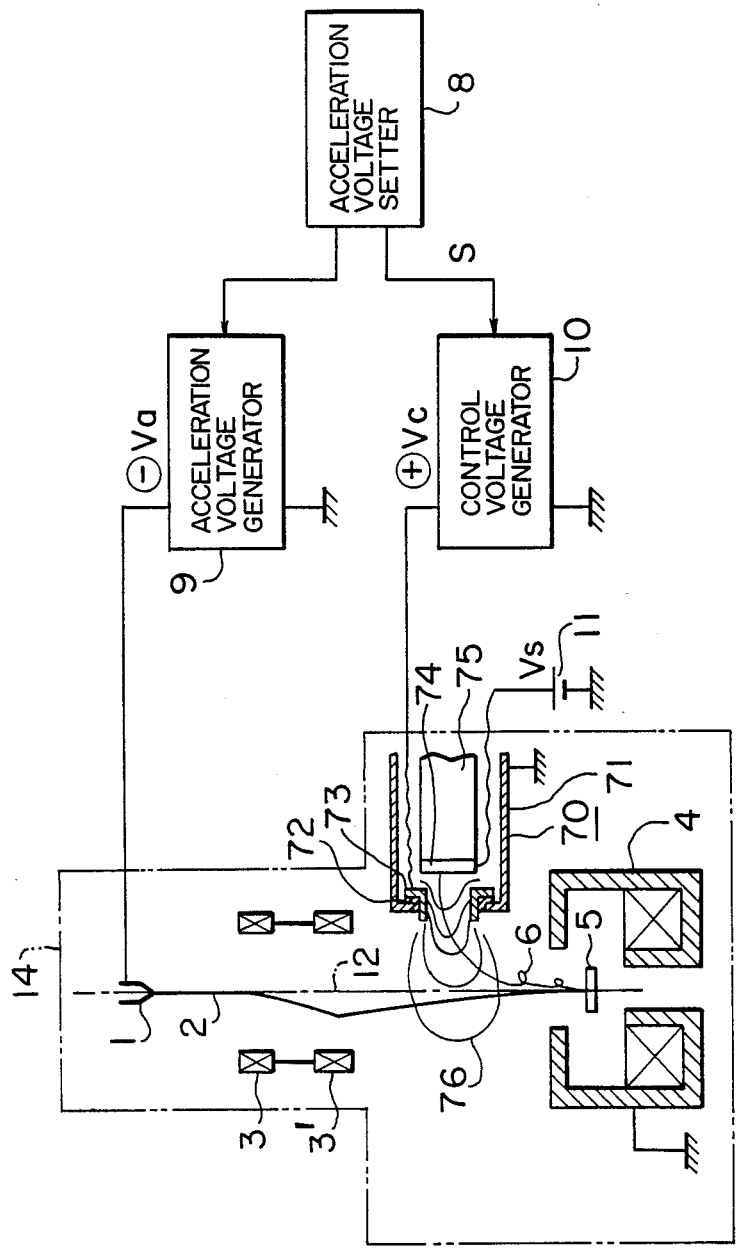
FIG. 2 is a schematic diagram illustrating a scanning electron microscope according to an embodiment of the invention.

Referring now to FIG. 2, one embodiment of the invention will now be described. This embodiment is directed to the latter method wherein the control electrode for control of permeant electric field is disposed before the detector and control voltage applied to the control electrode is changed in interlocked relationship with acceleration voltage for the primary electron beam.

In FIG. 2, reference numeral 1 designates a primary electron beam source, 2 a primary electron beam, 3 and 3' paired deflection coils for deflecting and scanning the primary electron beam 2, 4 an objective lens and 5 a specimen to be observed. A scanning electron microscope has a vacuum optical column 14 as illustrated at phantom line. The primary electron beam 2 emitted from the primary electron beam source 1 is accelerated along an optical axis 12 under the application of an acceleration voltage Va fed from an acceleration voltage generator 9, focused into a fine spot by means of a focus lens system (not shown), and projected on the specimen 5. The primary electron beam 2 is deflected by the paired deflection coils 3 and 3' and scanned two-dimensionally on the specimen 5. Secondary electrons 6 released from the specimen 5 bombarded with the primary electron beam 2 are attracted and accelerated by an electric field 76 created by a high voltage Vs applied to a scintillator 74 of a secondary electron detector 70 to impinge upon the scintillator 74 and cause it to scintillate. Radiation from the scintillator 74 is converted by a photomultiplier 75 into an electric signal which can be measured. A high voltage Vs fed from a power supply 11 is applied to the scintillator.

In this embodiment, a control electrode 73 for control of intensity of an electric field 76 permeating into the primary electron beam path is mounted in an opening of a shield electrode (grounded electrode) by means of an insulating spacer 72, and a control voltage Vc fed from a control voltage generator 10 is applied to the control electrode 73. The control voltage generator 10 is responsive to a signal S from an acceleration voltage setter 8 to change the control voltage Vc in interlocked relationship with the change of the acceleration voltage Va fed from the acceleration voltage generator 9 also responsive to a signal from the setter 8.

With this construction, when a value of primary electron acceleration voltage Va is set by the acceleration voltage setter 8, the acceleration voltage generator 9 generates a desired acceleration voltage Va which in turn is applied to the primary electron beam source 1. At the same time, the control voltage generator 10 generates a control voltage Vc; complying with the acceleration voltage Va, which is applied to the control electrode 73. The control voltage Vc applied to the control electrode 73 play a role in controlling the degree of the permeation of electric field into the primary electron beam path due to the scintillator voltage Vs applied to the scintillator 74. More particularly, when the primary electron beam acceleration voltage Va is high, the control voltage Vc is raised to invensify the permeant field, thereby improving detection efficiency of the detector but conversely, when the primary electron beam acceleration voltage Va is low and the permeant field is too intensive to match the low acceleration voltage Va, the control voltage Vc is lowered to weaken the permeant field. The value of the control voltage Vc applied to the control electrode 73 is controlled such that the permeant field 76 may have a value of intensity which does not almost deflect the primary electron beam 2, and the relation between values of Va and Vc to this end is experimentally determined in advance and is precedently set and stored in the control voltage generator 10.

This can ensure that the primary electron beam 2 can always be conditioned so as not to be affected by unwanted deflection due to the permeant field even when the acceleration voltage for the primary electron beam changes over the wide acceleration voltage range, with the result that the primary electron beam 2 can always impinge upon a location nearby the center axis of the objective lens 4 and hence can not be affected by off-axial aberration of the objective lens 4, thus preventing the secondary electron image from being degraded in resolution. The relation between acceleration voltage Va and control voltage Vc can be of a continuous function which is determined in advance or alternatively the control voltage Vc may be related to the acceleration voltage Va in such a manner that the control voltage Vc changes stepwise in accordance with each range of values of the acceleration voltage Va. In essentiality, the control voltage Vc should be changed in interlocked relationship with the change of the acceleration voltage Va while being maintained in predetermined relationship with the acceleration voltage Va.

Figure 3:
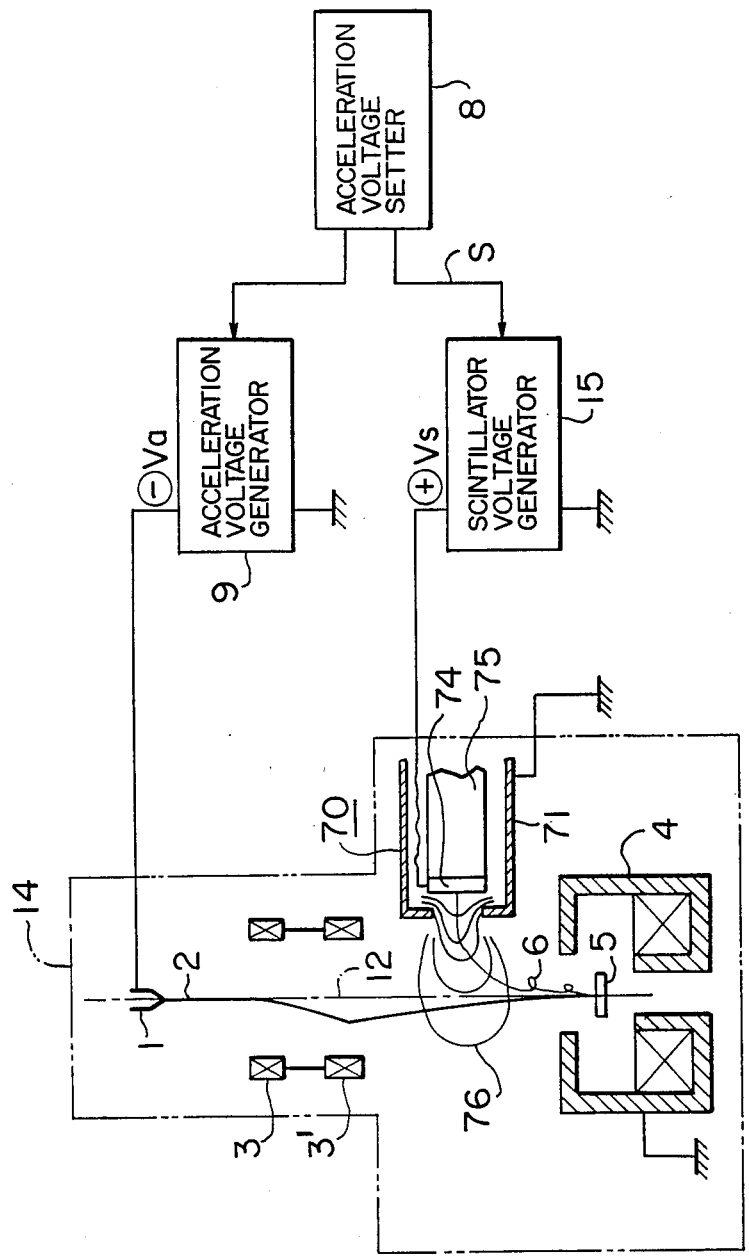
FIG. 3 is a schematic diagram illustrating a scanning electron microscope according to another embodiment of the invention.

Referring to FIG. 3, there is illustrated another embodiment of the invention. This embodiment is directed to the former method described above wherein voltage applied to the scintillator portion per se of the detector is controlled in accordance with acceleration voltage for the primary electron beam. More specifically, in the embodiment of FIG. 3, scintillator voltage Vs applied to a scintillator 74 of a secondary electron detector 70 is changed by means of a scintillator voltage generator 15 in compliance with the change of acceleration voltage Va. To describe more specifically, when the primary electron beam acceleration voltage Va is high, the scintillator voltage Vs is also raised to promote detection efficiency of the detector but conversely, when the acceleration voltage Va is low and the permeant field is too extensive to match the low acceleration voltage, the scintillator voltage Vs is lowered to weaken the permeant field. Obviously, this embodiment dispenses with the control electrode 73 used in the FIG. 2 embodiment. In this embodiment, too, the relation between acceleration voltage Va and scintillator voltage Vs should obviously be set precedently to meet the condition that an electric field 76 permeating into the primary electron beam path always deflects the primary electron beam 2 only negligibly.

While in the foregoing embodiments the specimen 5 is disposed in an interior space of the objective lens 4, the invention is not limited thereto and may be applied to an apparatus having a specimen 5 disposed, for example, below the objective lens 4, attaining the same effects. The invention has been described as being applied to the apparatus using the electron beam but obviously it may also be applied to an apparratus using an ion beam in a similar manner.

Figure 1:
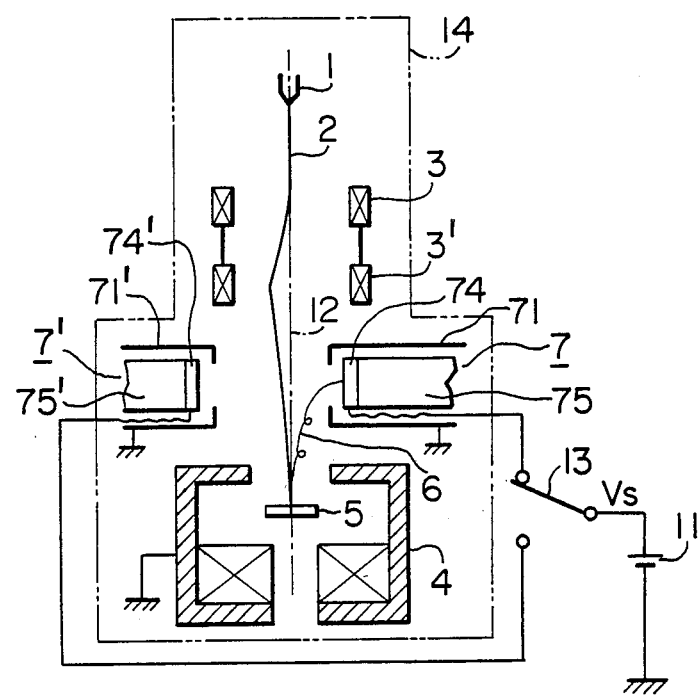
FIG. 1 is a schematic diagram illustrating a prior art scanning electron microscope using a plurality of secondary electron detectors.

Referring to FIG. 1, a prior art apparatus is schematically illustrated for comparison. As shown, in the prior art apparatus, a plurality of (two in the figure) secondary electron detectors 7 and 7' are provided at positions which are differently distant from the optical axis 12 for the primary electron beam and either one of the plurality of detectors is switched on for use pursuant to operator's decision in compliance with the change of the primary electron beam acceleration voltage. More specifically, for higher acceleration voltages, the detector 7 close to the optical axis 12 is selectively used to promote detection efficiency but conversely, for lower acceleration voltages, the detector 7' remote from the optical axis 12 is selectively used to weaken the permeant field created by the detector 7' to thereby suppress the unwanted deflection effect of the permeant field upon the primary electron beam. The switchover is effected by manually transferring a switch 13 so that scintillator voltage Vs from a power supply 11 is applied to either one of the two detectors. In FIG. 1, reference numerals 71 and 71' designate shield electrodes, 74 and 74' scintillators and 75 and 75' photomultipliers. The prior art apparatus is disadvantageous in that the plurality of secondary electron detectors are needed, that installation space for the plural detectors is difficult to accommodate, that the limited number of detectors used makes it difficult to continuously comply with the change of primary electron beam acceleration voltage over a wide range, and that artificial decision by the operator is needed.

In contrast, according to the invention, intensity of the permeant field in the primary electron beam path created by high voltage applied to the secondary electron detector can automatically be controlled to an extent that the permeant field always deflects the primary electron beam only negligibly whenever the primary electron beam acceleration voltage takes any values, thereby attaining advantages that only one secondary electron detector suffices and the optimum condition can always be set up by continuously complying with the change of primary electron beam acceleration voltage over the wide range.

I claim:

1. A scanning electron microscope comprising:
   an electron beam source for producing a finely focused primary electron beam;
   means for applying to said electron beam source an acceleration voltage for accelerating the primary electron beam;
   a specimen bombarded with the accelerated primary electron beam;
   a secondary electron detector for detecting secondary electrons released from said specimen;
   means for applying to said secondary electron detector a voltage for attracting the secondary electrons to said secondary electron detector; and
   electric field control means for changing intensity of an electric field created by the voltage applied to said secondary electron detector in the path of the accelerated primary electron beam, in compliance with the change of the acceleration voltage applied to said electron beam source.

2. A scanning electron microscope according to claim 1 wherein said electric field control means comprises means for changing the voltage per se, applied to said secondary electron detector, in compliance with the change of the acceleration voltage applied to said electron beam source.

3. A scanning electron microscope according to claim 1 wherein said electric field control means comprises a control electrode interposed between said secondary electron detector and primary electron beam path, and means for changing a voltage applied to said control electrode in compliance with the change of the acceleration voltage applied to said electron beam source.

4. A scanning electron microscope according to claim 1 wherein said specimen is disposed in an interior space of an objective lens for projecting the primary electron beam on said specimen and said secondary electron detector is interposed near said objective lens between said objective lens and electron beam source.

* * * * *